United States Patent
Chung et al.

(10) Patent No.: US 8,330,150 B2
(45) Date of Patent: Dec. 11, 2012

(54) ORGANIC LIGHT-EMITTING DISPLAY DEVICE

(75) Inventors: Hyun-Joong Chung, Yongin (KR); Jin-Seong Park, Yongin (KR); Jong-Han Jeong, Yongin (KR); Jae-Kyeong Jeong, Yongin (KR); Yeong-Gon Mo, Yongin (KR); Min-Kyu Kim, Yongin (KR); Tae-Kyung Ahn, Yongin (KR); Hui-Won Yang, Yongin (KR); Kwang-Suk Kim, Yongin (KR); Eun-Hyun Kim, Yongin (KR); Jae-Wook Kang, Yongin (KR); Jae-Soon Im, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 216 days.

(21) Appl. No.: 12/829,139

(22) Filed: Jul. 1, 2010

(65) Prior Publication Data
US 2011/0095274 A1   Apr. 28, 2011

(30) Foreign Application Priority Data
Oct. 27, 2009   (KR) .................. 10-2009-0102282

(51) Int. Cl.
*H01L 29/08* (2006.01)
(52) U.S. Cl. ............... 257/40; 257/43; 257/59; 257/72; 257/642; 257/E51.005; 257/E51.018; 257/E51.024
(58) Field of Classification Search .............. 257/40, 257/43, 59, 72, 642, E51.005, E51.018, E51.024
See application file for complete search history.

(56) References Cited

U.S. PATENT DOCUMENTS

| | | | |
|---|---|---|---|
| 7,057,675 B2 * | 6/2006 | Ha | 349/38 |
| 2006/0189047 A1 * | 8/2006 | Yamazaki et al. | 438/149 |
| 2010/0025677 A1 * | 2/2010 | Yamazaki et al. | 257/43 |

FOREIGN PATENT DOCUMENTS

| | | |
|---|---|---|
| KR | 10-0215768 B1 | 5/1999 |
| KR | 10-0252953 B1 | 1/2000 |
| KR | 10-2007-0072766 A | 7/2007 |
| KR | 10-2009-0105560 A | 10/2009 |

* cited by examiner

OTHER PUBLICATIONS

Official Action issued by the Korean Industrial Property Office on Apr. 12, 2011 in related Korean Patent Application No. 10-2009-0102282. Registration Determination Certificate issued by the Korean Industrial Property Office on Oct. 31, 2011 in related Korean Patent Application No. 10-2009-0102282.

*Primary Examiner* — Andy Huynh
(74) *Attorney, Agent, or Firm* — Knobbe, Martens, Olson & Bear LLP

(57) ABSTRACT

An organic light-emitting display device, which may be configured to prevent moisture or oxygen from penetrating the organic light-emitting display device from the outside is disclosed. An organic light-emitting display device, which is easily applied to a large display device and/or may be easily mass produced is further disclosed. Additionally disclosed is a method of manufacturing an organic light-emitting display device. An organic light-emitting display device may include, for example, a thin-film transistor (TFT) including a gate electrode, an active layer insulated from the gate electrode, source and drain electrodes insulated from the gate electrode and contacting the active layer and an insulating layer disposed between the source and drain electrodes and the active layer; and an organic light-emitting diode electrically connected to the TFT. The insulating layer may include, for example, a first insulating layer contacting the active layer; and a second insulating layer formed of a metal oxide and disposed on the first insulating layer.

10 Claims, 5 Drawing Sheets

ORGANIC LIGHT-EMITTING DISPLAY DEVICE

CROSS-REFERENCE TO RELATED APPLICATIONS

This application claims the benefit of Korean Patent Application No. 10-2009-0102282, filed on Oct. 27, 2009, in the Korean Intellectual Property Office, the disclosure of which is incorporated herein in its entirety by reference.

BACKGROUND

The present invention relates to an organic light-emitting display device including a thin-film transistor (TFT) and a method of manufacturing the same.

DESCRIPTION OF THE RELATED ART

An active matrix type organic light-emitting display device includes a thin-film transistor (TFT), and an organic light-emitting diode connected to the TFT in each pixel. An active layer of the TFT is formed of amorphous silicon or polysilicon. Recently, there have also been attempts to use an oxide semiconductor to form the active layer. Properties, such as a threshold voltage and an S-factor, of the oxide semiconductor, however, can easily change due to moisture or oxygen that penetrates the organic light-emitting display device from the outside. Such a change of the threshold voltage due to moisture or oxygen is accelerated by a direct current (DC) bias of a gate electrode while driving the TFT. Thus, DC stability is an important factor when using the oxide semiconductor.

To strengthen barrier characteristics of the oxide semiconductor against moisture or oxygen, an aluminum oxide ($AlO_x$) layer or a titanium nitride (TiN) layer may be applied to a substrate, but since the $AlO_x$ or TiN layer is prepared by using a reactive sputtering method or an atomic layer deposition (ALD) method, it is difficult to apply the $AlO_x$ or TiN layer to a large substrate and its mass productivity is low.

SUMMARY OF CERTAIN INVENTIVE ASPECTS

Some aspects of the present disclosure relate to an organic light-emitting display device including a thin-film transistor (TFT) configured to prevent moisture or oxygen from penetrating the organic light-emitting display device from the outside. Other aspects of the present disclosure relate to a method of manufacturing an organic light-emitting display device.

In one aspect, an organic light-emitting display device may be easily applied to a large display device.

In another aspect, an organic light-emitting display device may be easily mass produced.

In another aspect a method of manufacturing the organic light-emitting display device is disclosed.

In another aspect, an organic light-emitting display device includes, for example, a thin-film transistor (TFT) comprising a gate electrode, an active layer insulated from the gate electrode, source and drain electrodes insulated from the gate electrode and contacting the active layer, and an insulating layer formed between the source and drain electrodes and the active layer and an organic light-emitting diode electrically connected to the TFT.

In some embodiments, the insulating layer includes, for example, a first insulating layer contacting the active layer and a second insulating layer substantially formed from a metal oxide and formed on the first insulating layer. In some embodiments, the second insulating layer has a gradient of metal content with respect to its thickness. In some embodiments, the metal content decreases toward the first insulating layer. In some embodiments, the metal is substantially formed from aluminum, titanium, or an alloy thereof. In some embodiments, the insulating layer further comprises a third insulating layer substantially formed from a metal oxide or a metal nitride and formed on the second insulating layer. In some embodiments, the insulating layer further comprises a fourth insulating layer formed on the third insulating layer. In some embodiments, the third insulating layer is substantially formed from aluminum oxide, aluminum nitride, titanium oxide or titanium nitride. In some embodiments, a metal layer is formed between the second insulating layer and the third insulating layer. In some embodiments, the metal layer is substantially formed from aluminum, titanium or an alloy thereof. In some embodiments, the active layer is substantially formed from an oxide semiconductor. In some embodiments, the first insulating layer is substantially formed from silicon oxide.

In another aspect, a method of manufacturing an organic light-emitting display device includes, for example, forming a gate electrode on a substrate; forming a gate insulating layer covering the gate electrode on the substrate; forming an active layer on the gate insulating layer; forming an insulating layer covering a channel region of the active layer; forming source and drain electrodes contacting the active layer and formed on the insulating layer and forming an organic light-emitting diode to be electrically connected to one of the source and drain electrodes.

In some embodiments, the forming of the insulating layer includes, for example, forming a first insulating layer covering the channel region of the active layer and forming a second insulating layer from a metal oxide on the first insulating layer. In some embodiments, the forming of the second insulating layer includes, for example, forming a metal layer on the first insulating layer and thermal-processing at least the metal layer so as to form a part of the metal layer contacting the first insulating layer as a metal oxide. In some embodiments, the second insulating layer has a gradient of metal content with respect to its thickness. In some embodiments, the metal content decreases toward the first insulating layer. In some embodiments, the metal is substantially formed from aluminum, titanium or an alloy thereof. In some embodiments, the method further includes, for example, forming a third insulating layer is substantially formed of a metal oxide or a metal nitride on the second insulating layer. In some embodiments, the forming of the third insulating layer includes, for example, forming a metal layer on the first insulating layer and forming a part of the metal layer as the third insulating layer by oxidizing or nitrifying a surface of the metal layer opposite of the first insulating layer. In some embodiments, the method further includes, for example, forming a fourth insulating layer on the third insulating layer. In some embodiments, the third insulating layer is substantially formed from aluminum oxide, aluminum nitride, titanium oxide or titanium nitride. In some embodiments, a metal layer is formed between the second insulating layer and the third insulating layer. In some embodiments, the metal layer is substantially formed from aluminum, titanium or an alloy thereof. In some embodiments, the active layer is substantially formed of an oxide semiconductor. In some embodiments, the first insulating layer is substantially formed of silicon oxide.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus according to some of the described embodiments can have several aspects, no single one of which necessarily is solely responsible for the desirable attributes of the apparatus. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
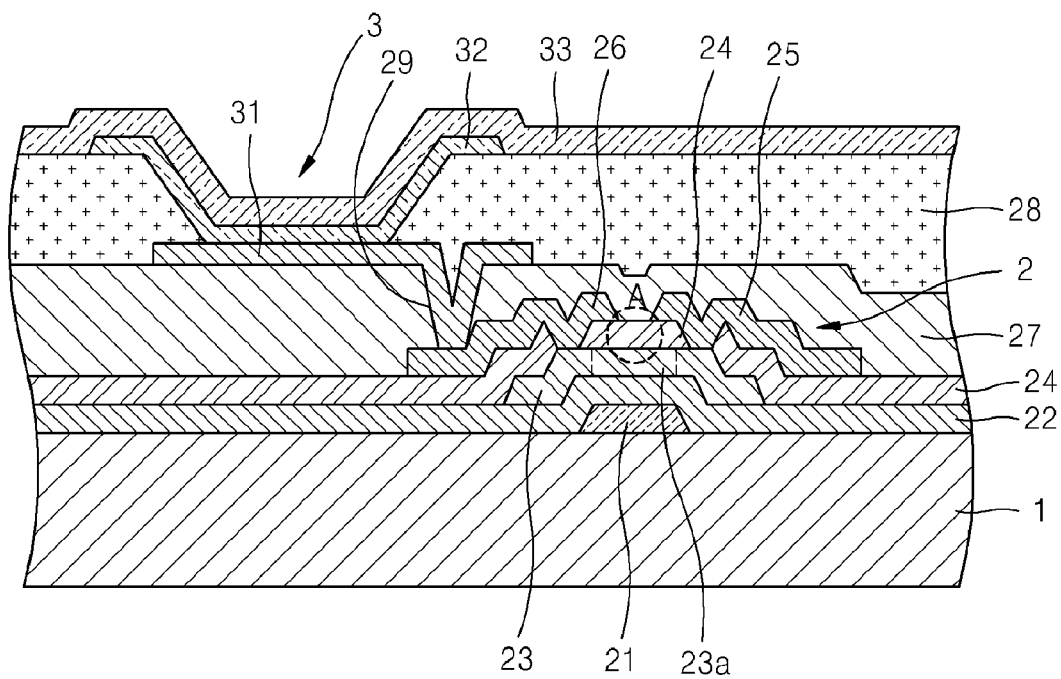
FIG. 1 is a cross-sectional view schematically illustrating an organic light-emitting display device according to an embodiment of the present disclosure.

In the following detailed description, only certain exemplary embodiments have been shown and described, simply by way of illustration. As those skilled in the art would realize, the described embodiments may be modified in various different ways, all without departing from the spirit or scope of the present disclosure. Further, in several exemplary embodiments, constituent elements having the same construction are assigned the same reference numerals and are representatively described in connection with a first exemplary embodiment. In the remaining exemplary embodiments, constituent elements different from those of the first exemplary embodiment are described. To clarify the description of the exemplary embodiments, the same reference numbers will be used throughout the drawings to refer to the same or like parts. Further, the size and thickness of each of the elements shown in the drawings are arbitrarily shown for better understanding and ease of description, and the embodiments are not limited thereto.

In addition, in the drawings, the thickness of layers, films, panels, regions, etc., are exaggerated for clarity. The thickness of the layers, films, panels, regions, etc., is enlarged in the drawings for better understanding and ease of description. Accordingly, the drawings and description are to be regarded as illustrative in nature and not restrictive. It will be understood that when an element such as a layer, film, region, or substrate is referred to as being "on" another element, it can be directly on the other element or intervening elements may also be interposed therebetween. Also, when an element is referred to as being "connected to" another element, it can be directly connected to the other element or be indirectly connected to the other element with one or more intervening elements interposed therebetween.

FIG. 1 is a cross-sectional view schematically illustrating an organic light-emitting display device according to an embodiment of the present disclosure. Referring to FIG. 1, a thin-film transistor (TFT) 2 and an organic light-emitting diode 3 are disposed on a substrate 1. FIG. 1 is a part of one pixel of the organic light-emitting display device, and the organic light-emitting display device includes a plurality of pixels. The TFT 2 may include a gate electrode 21 formed on the substrate 1, a gate insulating layer 22 covering the gate electrode 21, an active layer 23 formed on the gate insulating layer 22, an insulating layer 24 formed on the gate insulating layer 22 to cover the active layer 23, and source and drain electrodes 25 and 26 contacting the active layer 23 and disposed on the insulating layer 24. The TFT 2 of FIG. 1 has a bottom gate structure; however the structure of the TFT 2 is not limited thereto, and may be a top gate structure.

A buffer layer (not shown) may be formed on the substrate 1, wherein the buffer layer is formed of an inorganic material, such as silicon oxide. The gate electrode 21 formed on the substrate 1 may include a single layer or a plurality of layers formed of conductive metal. The gate electrode 21 may include molybdenum. The gate insulating layer 22 may be formed of silicon oxide, tantalum oxide, or aluminum oxide, but a material for forming the gate insulating layer 22 is not limited thereto. The active layer 23 is formed on the gate insulating layer 22 by using a patterning method. The active layer 23 may be formed of an oxide semiconductor. For example, the active layer 23 may be a gallium-indium-zinc-oxide (G-I-Z-O) layer, such as an $(In_2O_3)a(Ga_2O_3)b(ZnO)c$ layer, wherein a, b, and c are each independently a real number, and wherein $a \geq 0$, $b \geq 0$, and $c > 0$.

The insulating layer 24 is formed to cover the active layer 23. The insulating layer 24 may also be formed to protect a channel region 23a of the active layer 23 and, as shown in FIG. 1, the insulating layer 24 may be formed to cover the entire active layer 23, excluding regions contacting the source and drain electrodes 25 and 26. Thus, as depicted in FIG. 1 the insulating layer 24 is formed on the active layer 23 and also extends between a passivation layer 27 (discussed further below) and the gate insulating layer 22 on either side of the active layer 23. A location where the insulating layer 24 is formed is not limited to the discussion above or to the embodiment of FIG. 1. For example, the insulating layer 24 may be formed only on the channel region 23a of the active layer 23.

The source electrode 25 and the drain electrode 26 that are formed on the insulating layer 24 are configured to contact the active layer 23. A passivation layer 27 may be formed on the insulating layer 24 to cover the source and drain electrodes 25 and 26. A first electrode 31 of the organic light-emitting diode 3 may be formed on the passivation layer 27 and may contact the drain electrode 26 by forming a via-hole 29 in the passivation layer 27. A pixel defining layer 28 exposing a part of the first electrode 31 is formed on the passivation layer 27, and an organic layer 32 and a second electrode 33 are formed on the first electrode 31 exposed by the pixel defining layer 28. The first electrode 31 may be patterned according to each pixel.

When the organic light-emitting display device is a top-emissive type realizing an image toward the second electrode 33, the first electrode 31 may be a reflective electrode. Accordingly, the first electrode 31 may include a reflective layer formed of an alloy including aluminum (Al), silver (Ag), or the like. When the first electrode 31 is an anode, the first electrode 31 may be formed of a metal oxide having a high absolute value of work function, such as indium tin oxide (ITO), indium zinc oxide (IZO), indium oxide $(In_2O_3)$ or zinc oxide (ZnO). On the other hand, when the first electrode 31 is a cathode, the first electrode 31 may be formed of a high conductive metal having a low absolute value of work function, such as Ag, magnesium (Mg), Al, platinum (Pt), palladium (Pd), gold (Au), nickel (Ni), neodymium (Nd), iridium (Ir), chromium (Cr), lithium (Li) or calcium (Ca). Accordingly, when the first electrode 31 is a cathode, the first electrode 31 may not include a reflective layer.

The second electrode 33 may be a transmissive electrode. Accordingly, the second electrode 33 may include a thin semi-transmissive reflective layer formed of Ag, Mg, Al, Pt, Pd, Au, Ni, Nd, Ir, Cr, Li, or Ca or a transmissive metal oxide, such as ITO, IZO or ZnO. When the first electrode 31 is an anode, the second electrode 33 is a cathode and when the first electrode 31 is a cathode, the second electrode 33 is an anode. The organic layer 32 disposed between the first electrode 31 and the second electrode 33 may include one or more of a hole injection layer, a hole transport layer, an emission layer, an electron injection layer, and an electron transport layer. Here, in the embodiment of FIG. 1 the emission layer is included. Although not illustrated in FIG. 1, a protective layer may be formed on the second electrode 33 and the organic light-emitting display device may be sealed by using glass.

Figure 2:
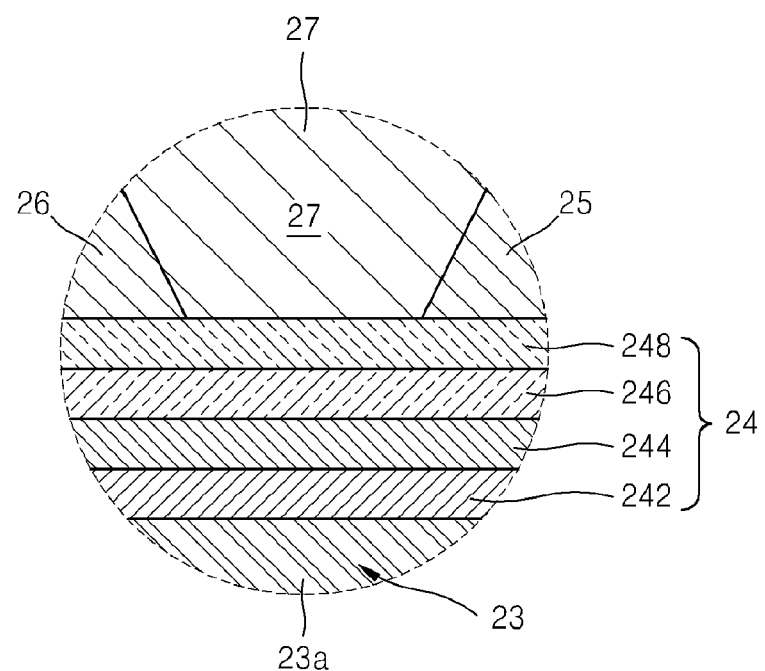
FIG. 2 is a cross-sectional view of a portion A of FIG. 1, according to an embodiment of the present disclosure.

The insulating layer 24 may be formed as shown in FIG. 2. FIG. 2 is a cross-sectional view of a region "A" of FIG. 1, according to an embodiment of the present disclosure. Referring to FIG. 2, the insulating layer 24 includes a first insulating layer 242 contacting the active layer 23, a second insulating layer 244 disposed on the first insulating layer 242, a third insulating layer 246 disposed on the second insulating layer 244 and a fourth insulating layer 248 disposed on the third insulating layer 246. The first insulating layer 242 may include, for example, an oxide layer formed of silicon oxide ($SiO_x$) using a plasma enhanced chemical vapor deposition (PECVD) method or a sputtering method. As will be described later, the first insulating layer 242 may protect the active layer 23 from being contaminated while forming a metal layer and may diffuse a metal according to a later thermal-process.

The second insulating layer 244 may be formed of a metal oxide and may have a gradient of metal content with respect to a thickness thereof. Here, the metal content of the second insulating layer 244 may decrease moving in a direction toward the first insulating layer 242. Accordingly, the metal content of the second insulating layer 244 is the highest near the third insulating layer 246 and the lowest near the first insulating layer 242. The metal of the second insulating layer 244 may include, for example, aluminum, titanium or an alloy thereof. Accordingly, the content of aluminum or titanium may be diffused in silicon oxide to have the concentration gradient according to the thickness of the second insulating layer 244. The third insulating layer 246 may be formed of metal oxide or metal nitride, for example, aluminum oxide, aluminum nitride, titanium oxide or titanium nitride. The fourth insulating layer 248 disposed on the third insulating layer 246 may be formed of silicon oxide, for example, like the first insulating layer 242.

As described above, the insulating layer 24 may have a stacked structure including the first insulating layer 242 through the fourth insulating layer 248 and may thus have a higher barrier effect with respect to the active layer 23 compared to a conventional insulating layer formed of a single layer of silicon oxide or silicon nitride. Accordingly, the insulating layer 24 may sufficiently protect the active layer 23 from moisture or oxygen. Also, as will be described later, a method of forming the first through fourth insulating layers 242 through 248 may be simple, and thus the insulating layer 24 may be easily applied to a large display.

Figure 3:
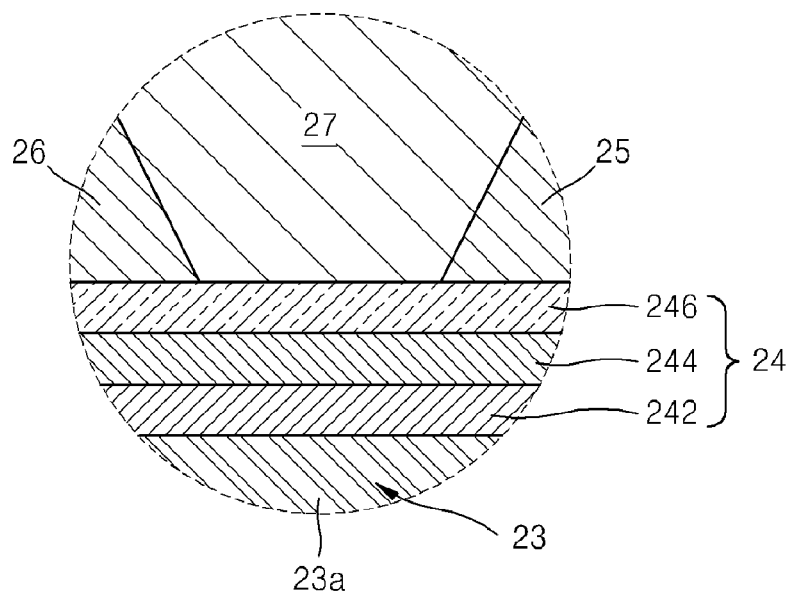
FIG. 3 is a cross-sectional view of a portion A of FIG. 1, according to another embodiment of the present disclosure.

FIG. 3 is a cross-sectional view of the portion A of FIG. 1, according to another embodiment of the present disclosure. Referring to FIG. 3, the fourth insulating layer 248 is omitted from the insulating layer 24 of FIG. 2. The fourth insulating layer 248 may not be formed if the insulating layer 24 has a sufficient barrier effect by stacking the first through third insulating layers 242 through 246.

Figure 4:
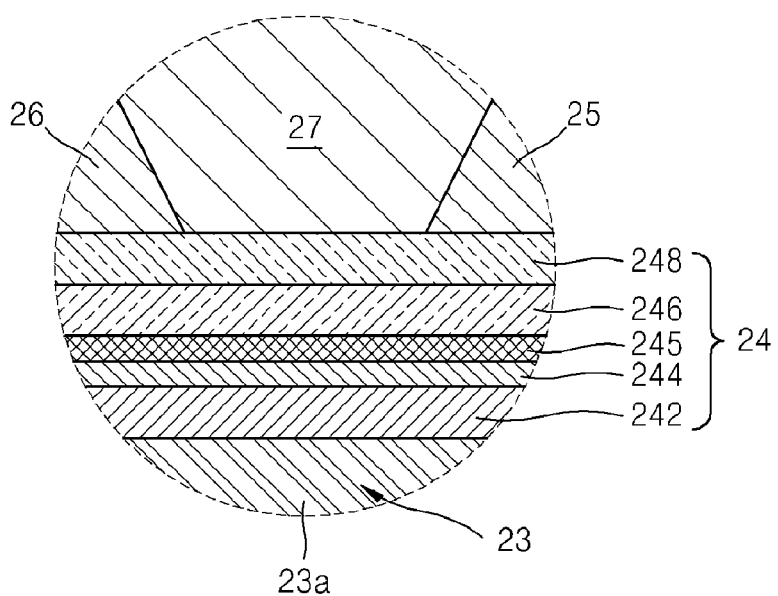
FIG. 4 is a cross-sectional view of a portion A of FIG. 1, according to another embodiment of the present disclosure.

FIG. 4 is a cross-sectional view of the portion A of FIG. 1, according to another embodiment of the present disclosure. Referring to FIG. 4, the insulating layer 24 further includes a metal layer 245 between the second insulating layer 244 and the third insulating layer 246 of FIG. 2. The metal layer 245 may be formed of aluminum, titanium or an alloy thereof. By disposing the metal layer 245, the barrier characteristics of the insulating layer 24 may be increased. Although not illustrated in detail, the metal layer 245 may not be formed contacting the source and drain electrodes 25 and 26 of FIG. 1, by oxidizing or nitrifying the ends of the metal layer 245 while oxidizing or nitrifying the metal layer 245.

Figure 5:
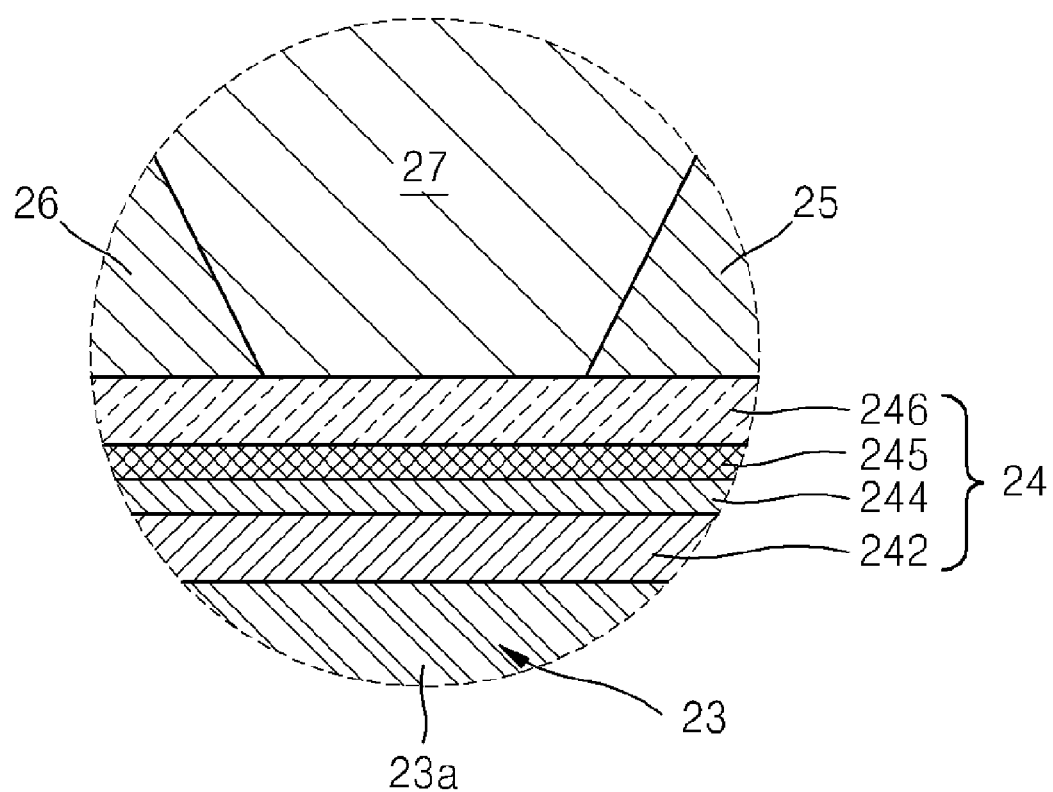
FIG. 5 is a cross-sectional view of a portion A of FIG. 1, according to another embodiment of the present disclosure.

FIG. 5 is a cross-sectional view of the portion A of FIG. 1, according to another embodiment of the present disclosure. Referring to FIG. 5, the insulating layer 24 further includes the metal layer 245 between the second insulating layer 244 and the third insulating layer 246 of FIG. 3. Details about the metal layer 245 are as described above with respect to FIG. 4. Although not illustrated in detail, if the metal layer 245 has a thickness to be diffused only to the first insulating layer 242, the insulating layer 24 may only include the first and second insulating layers 242 and 244.

A method of manufacturing the insulating layer 24 will now be described in detail. FIGS. 6A through 6E are cross-sectional views for describing a method of manufacturing the insulating layer 24 of FIG. 2. First, referring to FIG. 6A, the first insulating layer 242 is formed to cover the active layer 23 that is patterned as described with reference to FIG. 1. The first insulating layer 242 may be formed of silicon oxide using a PECVD method or a sputtering method. As described above, the first insulating layer 242 is configured to protect the active layer 23 from being contaminated while forming the metal layer 245, and also configured to diffuse a metal according to a later thermal-process.

Figure 6A:
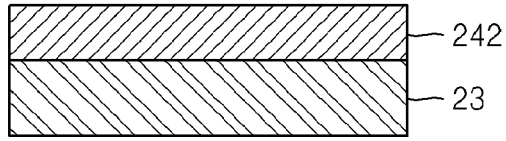
FIGS. 6A through 6E are cross-sectional views for describing a method of manufacturing an insulating layer of FIG. 2, according to an embodiment of the present disclosure.
Figure 6B:
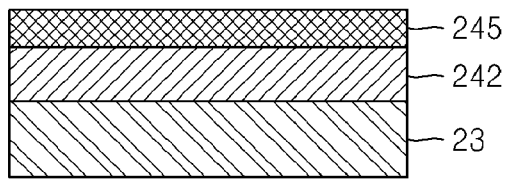

Then, referring to FIG. 6B, the metal layer 245 is formed on the first insulating layer 242. The metal layer 245 is formed of aluminum, titanium or an alloy thereof because an oxide or nitride layer of the aluminum or titanium is hard. The thickness of the metal layer 245 may be about 50 Å, but is not limited thereto.

Figure 6C:
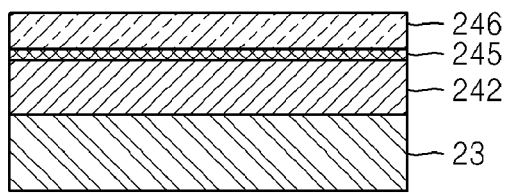
Figure 6D:
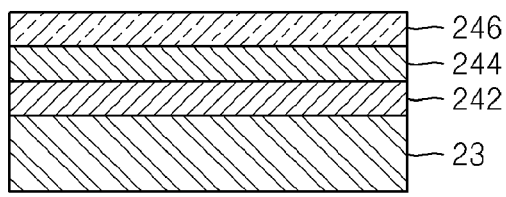

Next, as shown in FIG. 6C, the top of the metal layer 245 is converted to the third insulating layer 246. The third insulating layer 246 is formed by forming a metal oxide by thermal-processing the metal layer 245 under an oxygen atmosphere, or by forming a metal nitride by plasma-processing the metal layer 245 under a nitrogen atmosphere. In detail, the third insulating layer 246 may be formed of $AlO_x$ or TiN having excellent barrier characteristics, and the thickness of the third insulating layer 246 may be about 20 Å from the top of the metal layer 245. Here, when an additional thermal-process is performed at a temperature of about 250 Å to about 350 Å, the metal of the metal layer 245 diffuses into the oxide of the first insulating layer 242, and thus the top of the first insulating layer 242 and the metal layer 245 change to the second insulating layer 244 formed of metal oxide having a gradient of metal content, as shown in FIG. 6D. As a result, the metal layer 245 that was purely formed of the metal disappears and three layers, namely, the first through third insulating layers 242 through 246, are formed. The second insulating layer 244 may be formed by performing the thermal-process before forming the third insulating layer 246 through nitrification or oxidization. Further, the third insulating layer 246 may not be formed during nitrification or oxidization.

Figure 6E:
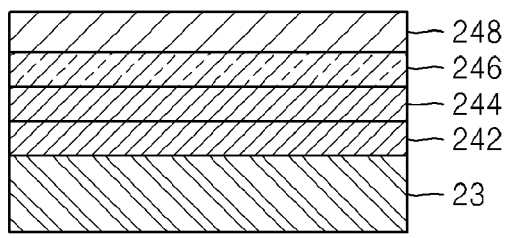

Then, in order to increase the thickness or productivity of the insulating layer 24, the fourth insulating layer 248 may be selectively formed on the third insulating layer 246 by using silicon oxide via a PECVD method or a sputtering method, as shown in FIG. 6E. As described above, since the insulating layer 24 formed of $AlO_x$ or TiN having excellent barrier characteristics is not formed by using a reactive sputtering method or an atomic layer deposition (ALD) method, the insulating layer 24 may be easily applied to a large substrate and may easily be mass produced.

Figure 7A:
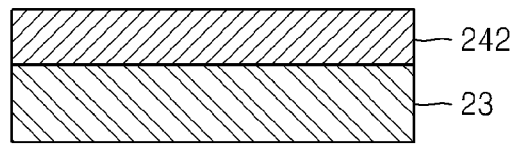
FIGS. 7A through 7E are cross-sectional views for describing a method of manufacturing an insulating layer of FIG. 4, according to another embodiment of the present disclosure.
Figure 7B:
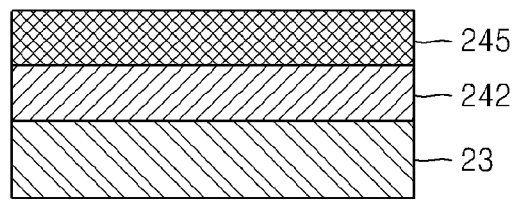
Figure 7C:
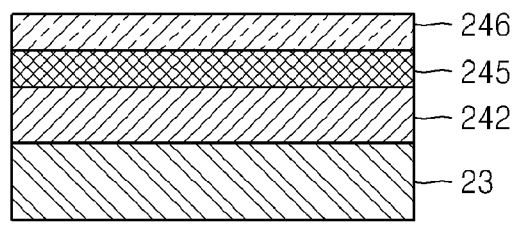
Figure 7D:
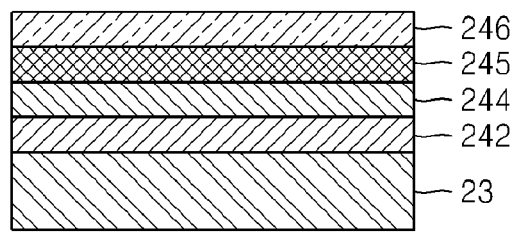
Figure 7E:
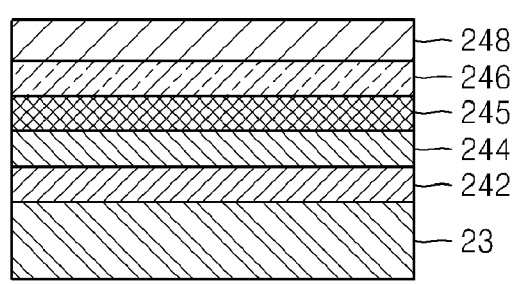

FIGS. 7A through 7E are cross-sectional views for describing a method of manufacturing the insulating layer 24 of FIG. 4, according to another embodiment of the present invention. In the method of FIGS. 7A through 7E, the processes shown in FIGS. 7A through 7C are identical respectively to the processes described with reference to FIGS. 6A through 6C. In FIG. 7D, while forming the second insulating layer 244 by thermal-processing the metal layer 245, a part of the metal layer 245 is remained, instead of diffusing all of the metal layer 245 into the first insulating layer 242, so that the metal layer 245 is disposed between the second insulating layer 244 and the third insulating layer 246. Accordingly, the insulating layer 24 has a four-layered structure. Then, to increase the thickness or productivity, the fourth insulating layer 248 may be selectively formed on the third insulating layer 246 by using silicon oxide via a PECVD method or a sputtering method, as shown in FIG. 7E. An insulating layer may be used to increase a barrier effect with respect to an active layer, and thus may sufficiently protect the active layer from moisture or oxygen. Also, since the insulating layer formed of $AlO_x$ or TiN having excellent barrier characteristics is not manufactured by using a reactive sputtering method or an ALD method, the insulating layer may be easily applied to a large substrate and may be easily mass produced.

It will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Further, while the present disclosure has described certain exemplary embodiments, it is to be understood that the scope of the disclosure is not limited to the disclosed embodiments, but, on the contrary, is intended to cover various modifications and equivalent arrangements included within the spirit and scope of the appended claims and equivalents thereof.

What is claimed is:

1. An organic light-emitting display device, comprising:
a thin-film transistor (TFT) comprising a gate electrode, an active layer insulated from the gate electrode, source and drain electrodes insulated from the gate electrode and contacting the active layer, and an insulating layer formed between the source and drain electrodes and the active layer; and
an organic light-emitting diode electrically connected to the TFT,
wherein the insulating layer comprises:
a first insulating layer contacting the active layer;
a second insulating layer substantially formed from a metal oxide and formed on the first insulating layer; and
a third insulating layer substantially formed from a metal oxide or a metal nitride and formed on the second insulating layer.

2. The organic light-emitting display device of claim 1, wherein the second insulating layer has a gradient of metal content with respect to its thickness.

3. The organic light-emitting display device of claim 2, wherein the metal content decreases toward the first insulating layer.

4. The organic light-emitting display device of claim 3, wherein the metal is substantially formed from aluminum, titanium, or an alloy thereof.

5. The organic light-emitting display device of claim 1, wherein the insulating layer further comprises a fourth insulating layer formed on the third insulating layer.

6. The organic light-emitting display device of claim 1, wherein the third insulating layer is substantially formed from aluminum oxide, aluminum nitride, titanium oxide or titanium nitride.

7. The organic light-emitting display device of claim 1, wherein a metal layer is formed between the second insulating layer and the third insulating layer.

8. The organic light-emitting display device of claim 7, wherein the metal layer is substantially formed from aluminum, titanium or an alloy thereof.

9. The organic light-emitting display device of claim 1, wherein the active layer is substantially formed from an oxide semiconductor.

10. The organic light-emitting display device of claim 1, wherein the first insulating layer is substantially formed from silicon oxide.

* * * * *